(12) United States Patent
Hackler, Sr. et al.

(10) Patent No.: US 7,154,135 B2
(45) Date of Patent: Dec. 26, 2006

(54) DOUBLE-GATED TRANSISTOR CIRCUIT

(75) Inventors: Douglas R. Hackler, Sr., Boise, ID (US); Stephen A. Parke, Nampa, ID (US)

(73) Assignee: American Semiconductor, Inc., Boise, ID (US)

( * ) Notice: Subject to any disclaimer, the term of this patent is extended or adjusted under 35 U.S.C. 154(b) by 0 days.

(21) Appl. No.: 11/273,362

(22) Filed: Nov. 14, 2005

(65) Prior Publication Data

US 2006/0060892 A1     Mar. 23, 2006

Related U.S. Application Data

(60) Division of application No. 10/719,119, filed on Nov. 21, 2003, now Pat. No. 7,019,342, which is a continuation-in-part of application No. 10/613,169, filed on Jul. 3, 2003, now Pat. No. 7,015,547.

(51) Int. Cl.
*H01L 27/148* (2006.01)
*H01L 29/768* (2006.01)

(52) U.S. Cl. ........................... 257/250; 257/347
(58) Field of Classification Search ............... 257/250, 257/347, 278
See application file for complete search history.

(56) References Cited

U.S. PATENT DOCUMENTS

| | | | |
|---|---|---|---|
| 6,248,626 B1 * | 6/2001 | Kumar et al. | 438/257 |
| 6,580,137 B1 * | 6/2003 | Parke | 257/401 |
| 2002/0093053 A1 * | 7/2002 | Chan et al. | 257/347 |
| 2002/0105039 A1 * | 8/2002 | Hanafi et al. | 257/401 |
| 2004/0041591 A1 * | 3/2004 | Forbes | 326/95 |

OTHER PUBLICATIONS

Lee et al., "Super Self-Aligned Double-Gate (SSDG) MOSFETs Utilizing Oxidation Rate Difference and Selective Epitaxy", IEEE, 1999, pp. 3.5.1-3.5.4.*

* cited by examiner

*Primary Examiner*—Phat X. Cao
(74) *Attorney, Agent, or Firm*—John R. Thompson; Stoel Rives LLP

(57) ABSTRACT

An OR gate circuit includes double-gated four terminal transistor with independent gate control. First and second inputs are independently coupled to the top and bottom gates of the transistor. The drain is coupled to an output and precharged to a low voltage. An input to either the top or bottom gates results in a high voltage to the drain and an output value of 1.

17 Claims, 14 Drawing Sheets

DOUBLE-GATED TRANSISTOR CIRCUIT

RELATED APPLICATIONS

This utility application claims priority to U.S. patent application Ser. No. 10/719,119 filed on Nov. 21, 2003, U.S. Pat. No. 7,019,342, and entitled Double-gated Transistor Circuit and to U.S. patent application Ser. No. 10/613,169 filed Jul. 3, 2003, U.S. Pat. No. 7,015,541, and entitled Multi-Configurable Independently Double-Gated MOSFET both of which are hereby incorporated by reference.

TECHNICAL FIELD

The present invention relates to the digital gate logic circuitry and, more specifically, to an inclusive OR gate.

BACKGROUND OF THE INVENTION

In the dynamic industry of circuit design, the goal is always to develop components that are smaller and more efficient. The basic module of all digital circuits is the gate. Unlike analog circuits, digital circuits can have a few discrete input states. A gate is a simple digital circuit that produces a specific, predictable output condition for each possible input condition. When a gate is combined with other gates, they are able to perform complex logical and arithmetic operations. Gates are the physical realization of simple Boolean expressions. A gate's operation may be described in mathematical terms and Boolean algebra may be used for analyzing a circuit having gates.

A common gate in digital logic design is the inclusive OR gate which performs the Boolean operation of disjunction. A Boolean variable has one of two values, such as 1 or 0 that are often referred to as TRUE or FALSE. In an electronic system there is either a voltage present to represent a value of 1 or no voltage present to represent a value of 0. Most computer languages, C++, FORTRAN, and BASIC, represent TRUE as non-zero and FALSE as 0. For input variables of 0 or 1, the inclusive OR gate outputs a value of 1 if one or more of its inputs values are 1. The inclusive OR gate output value of 0 only if all input values are 0. The term "OR gate" without a qualifier is generally taken to be an inclusive OR gate.

The OR gate may be implemented with relatively few components. For example, an OR gate may include two diodes in parallel or two transistors in parallel. In the transistor example, a gate voltage for one or both of the transistors provides a 1 value output. As can be expected, a vast number of OR gates are required in complex circuits. Even slight reductions in the size of an OR gate would result in significant improvements to the overall architecture It would be an advancement in the art to provide an OR gate circuit that is smaller, more efficient, and has superior gate voltage control. Such a device is disclosed and claimed herein.

SUMMARY OF THE INVENTION

The present invention provides an OR gate architecture that combines the function of two parallel transistors into a single transistor. The OR gate circuit includes a double-gated field effect transistor with independent gate control. The transistor includes a bottom gate disposed on a substrate and a dielectric layer disposed on the bottom gate. The source, channel, and drain are disposed on the dielectric layer to provide an electron flow controlled by gate voltages.

In one embodiment, the channel may have a U-shaped cross-sectional area to increase the channel length and gate control. A gate insulator is disposed on the channel with a top gate disposed on the channel. First and second insulating spacers are disposed on opposing sides of the top gate such that the first spacer is between the source and the top gate and the second spacer is between the drain and the top gate. The transistor may be surrounded with additional spacers and an isolation layer to provide full isolation.

The source includes a source extension that extends proximate to the first spacer and couples to the channel. Similarly, the drain includes a drain extension that extends proximate to the second spacer and couples to the channel. The spacers shield the channel from the field effect of the source and drain and further resist compression of the channel by the source and drain.

First and second inputs are coupled to the top and bottom gates of the transistor. An output of the OR circuit is coupled to the drain. The drain is coupled to an output and pre-charged to a low voltage. An input to either the top or bottom gates results in a high voltage to the drain and an output value of 1.

In an alternative embodiment, the drain is precharged to a high voltage. An input to either the top or bottom gates results in a low voltage to the drain and an output value of 0.

The single transistor OR gate reduces size, provides lower power dissipation, provides higher speed, and reduces instances of parasitic capacitance. Additional aspects and advantages of this invention will be apparent from the following detailed description of preferred embodiments, which proceeds with reference to the accompanying drawings.

BRIEF DESCRIPTION OF THE DRAWINGS

A more particular description of the invention briefly described above will be rendered by reference to the appended drawings. Understanding that these drawings only provide information concerning typical embodiments of the invention and are not therefore to be considered limiting of its scope, the invention will be described and explained with additional specificity and detail through the use of the accompanying drawings, in which.

DETAILED DESCRIPTION OF PREFERRED EMBODIMENTS

Figure 1:
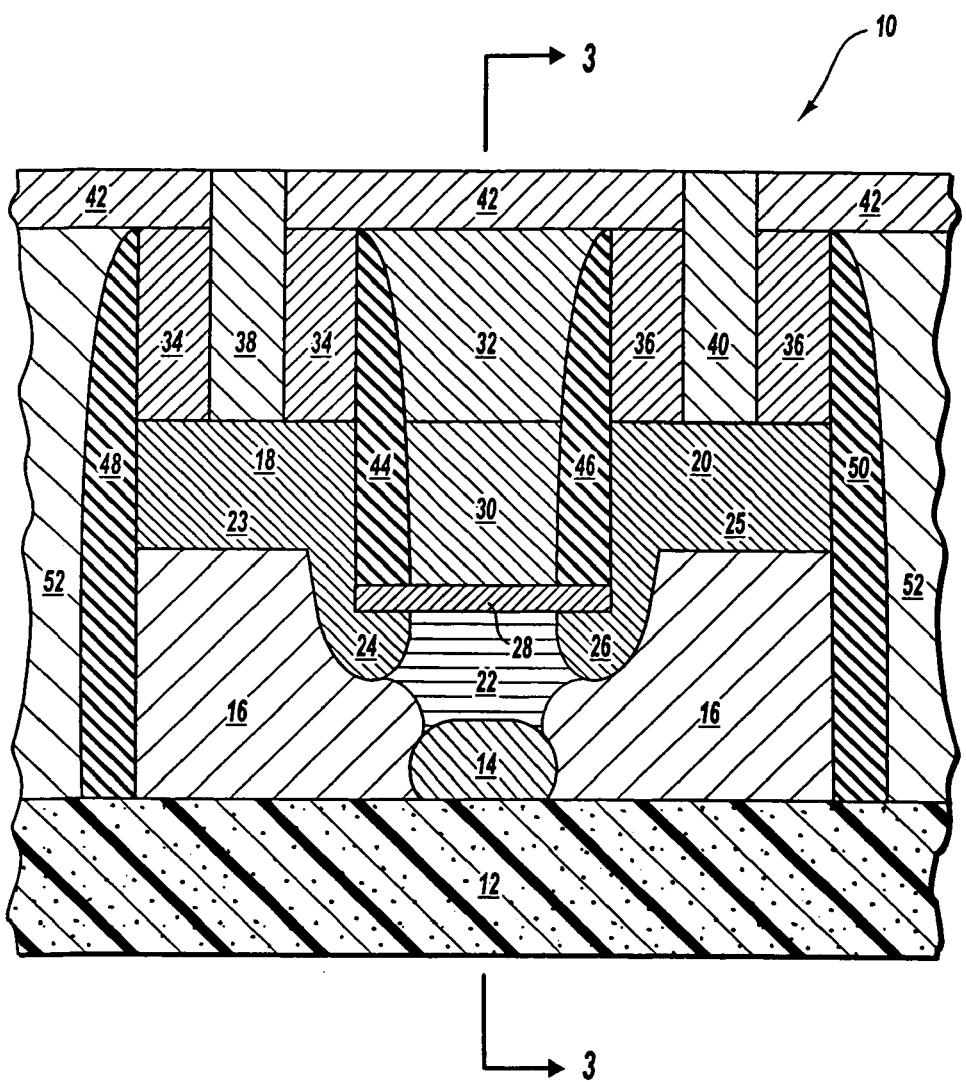
FIG. 1 is a cross-sectional view of an embodiment of a transistor of the present invention.

Reference is now made to the figures in which like reference numerals refer to like elements. For clarity, the first digit or digits of a reference numeral indicates the figure number in which the corresponding element is first used.

Throughout the specification, reference to "one embodiment" or "an embodiment" means that a particular described feature, structure, or characteristic is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. Those skilled in the art will recognize that the invention can be practiced without one or more of the specific details, or with other methods, components, materials, etc. In other instances, well-known structures, materials, or operations are not shown or not described in detail to avoid obscuring aspects of the invention.

In reference to FIGS. 1–20, a double-gated transistor suitable for use in the OR gate circuit of the present invention is discussed. One of skill in the art will appreciate that a double-gated field effect transistor of various configurations may also be used.

Referring to FIG. 1 a cross-sectional view of one embodiment of the double-gated transistor 10 of the present invention is shown. The illustrated transistor 10 discussed herein is an N-channel device, but may as well be embodied as a P-channel device as can be appreciated by one of skill in the art. The transistor 10 includes a substrate 12 that may be formed of any number of suitable materials. The substrate 12 may include silicon and a buried insulator such as silicon dioxide which is commonly referred to as a buried oxide layer.

A bottom gate 14 is disposed on the substrate 12 and includes a low resistance doped silicon material. The bottom gate 14 is highly doped, such as by ion implantation, to create a P+ bottom gate in the N-channel configuration. The transistor 10 includes a high-resistivity silicon on insulator (SOI) layer 16 that is preferably a P-type material. The SOI layer 16 may be formed by any number of available methods including SmartCut bonded, SIMOX, metal-induced polyrecrystallization, and so forth.

The source 18, drain 20, and channel 22 form a current flow path in accordance with MOSFET practice. The source 18 and drain 20 may be formed of any suitable N+ materials in an N-channel configuration. Formation of the source 18 and drain 20 may include deposition of an additional material layer or doping of the existing dielectric layer 16.

In a depletion type MOSFET, the channel 22 may include a layer of material that is the same as the source 18 and drain 20, such as an N-type material in the given example. The gate voltage can reduce the channel current by depleting carriers or increase the channel current by increasing carriers. In an enhancement type MOSFET, the channel 22 is an area extending into the P-type material of the dielectric layer 16. Application of a positive gate voltage pushes away the holes in the P-type material and attracts the moveable electrons in the N-type source 18 and drain 20 to form a channel 22. In FIG. 1, the channel 22 is defined as the area between the source 18, drain 20, bottom gate 14, and gate dielectric insulator 28. The channel 22 may therefore be an undoped region of the dielectric layer 16. As can be appreciated, the present invention is applicable to either depletion or enhancement type MOSFETs.

The source 18 includes a main body 23 that represents the majority of the source 18 and a source extension 24 that extends from the main body 23 to couple with the channel 22. The source extension 24 has significantly less cross-sectional area than the main body 23. Similarly, the drain 20 includes a main body 25, that is the majority of the drain 20, and a drain extension 26 that extends from the main body 25 and couples to the channel to enable electron flow. The drain extension 26 has significantly less cross-sectional area than the main body 25.

The extensions 24, 26 increase the distance of the main bodies 23, 25 from the channel 22 to reduce the short-channel effect created by the drain 20. However, in reducing the short-channel effect a resistance is created in the extensions 24, 26. This is acceptable given the superior gate control enabled by the reduced field effect. The extensions 24, 26 may be configured in various shapes in coupling to the main bodies 23, 25 to the channel 22.

A gate dielectric insulator 28 is disposed on the channel 22 and a top gate 30 is disposed on the gate dielectric insulator layer 28. The gate dielectric insulator 28 is a dielectric, such as silicon dioxide, that insulates the top gate 30 from the channel 22 as is well known in MOSFET architecture. The top gate 30 may be formed of any suitable metallic material such as Mo, W, Al, or TiN. A local interconnect 32 is disposed on the top gate 30 and may include any number of various materials including Al.

The transistor 10 further includes polish stop pad layers 34, 36 that are disposed on the source 18 and drain 20 respectively. The pad layers 34, 36 are formed of a dielectric material. Extending through each pad layer 34, 36 are one or more contact layers 38, 40 that couple to a respective source 18 and drain 20. An interlevel dielectric (ILD) layer 42 is disposed on the pad layer 34, 36 and also has the contact layers 38, 40 extending through to enable contact.

First and second spacers 44, 46 are disposed within to prevent contact between the top gate 30 and the source 18 and drain 20 as shown. The spacers may include any number of insulating materials such as silicon nitride or silicon oxide. The spacers 44, 46 further extend to prevent contact between the local interconnect 32 and the source and drain 18, 20.

As illustrated, the majority of the source 18 and drain 20 is disposed on one side of a corresponding spacer 44, 46. The source and drain extensions 24, 26 extend proximate to the spacers 44, 46 and couple to the channel 22. The disposition of the spacers 44, 46 and the extensions 24, 26 shield the channel 22 from the field effect of the source and drain 18, 20 while still providing contact to enable electron flow. As transistor size is reduced, the source and drain voltages interfere with the gate voltage and inhibit gate control of the channel 22. The present invention provides improved gate control of the channel 22 by limiting the field effect and capacitance of drain 20 voltages.

In one implementation, the pads 34, 36 include a different dielectric material than that of the spacers 44, 46. Thus, if the spacers 44, 46 are formed of a silicon nitride then the pads 34, 36 are formed of silicon oxide. Conversely, if the pads 34, 36 include a silicon nitride, then the spacers 44, 46 include silicon oxide.

The transistor 10 further includes third and fourth spacers 48, 50, formed of the same insulating material of the first and second spacers 44, 46. The third and fourth spacers 48, 50 extend vertically along the peripheral edges of the transistor 10. The spacers 48, 50 serve to isolate the transistors 10 from each other and provide radiation resistance and may be referred to as exterior spacers. As can be appreciated, the spacers 48, 50 may extend, alone or in conjunction with other spacers, to surround the components of the transistor 10. An insulating layer 52, such as a STI oxide, may further be disposed around the transistor 10 to provide further isolation. The transistor 10 is encapsulated within the insulating layer 52, spacers 48, 50, and ILD layer 42 to optimize performance.

The transistor architecture of the present invention provides a four-terminal device that allows the source 18, drain 20, bottom gate 14, and top gate 30 to be biased independently. The bottom gate 14 and the top gate 30 may be wired out to the left or right based on design constraints. Additional conducting and dielectric layers may be disposed on the transistor 10 based on design configurations.

Figure 2:
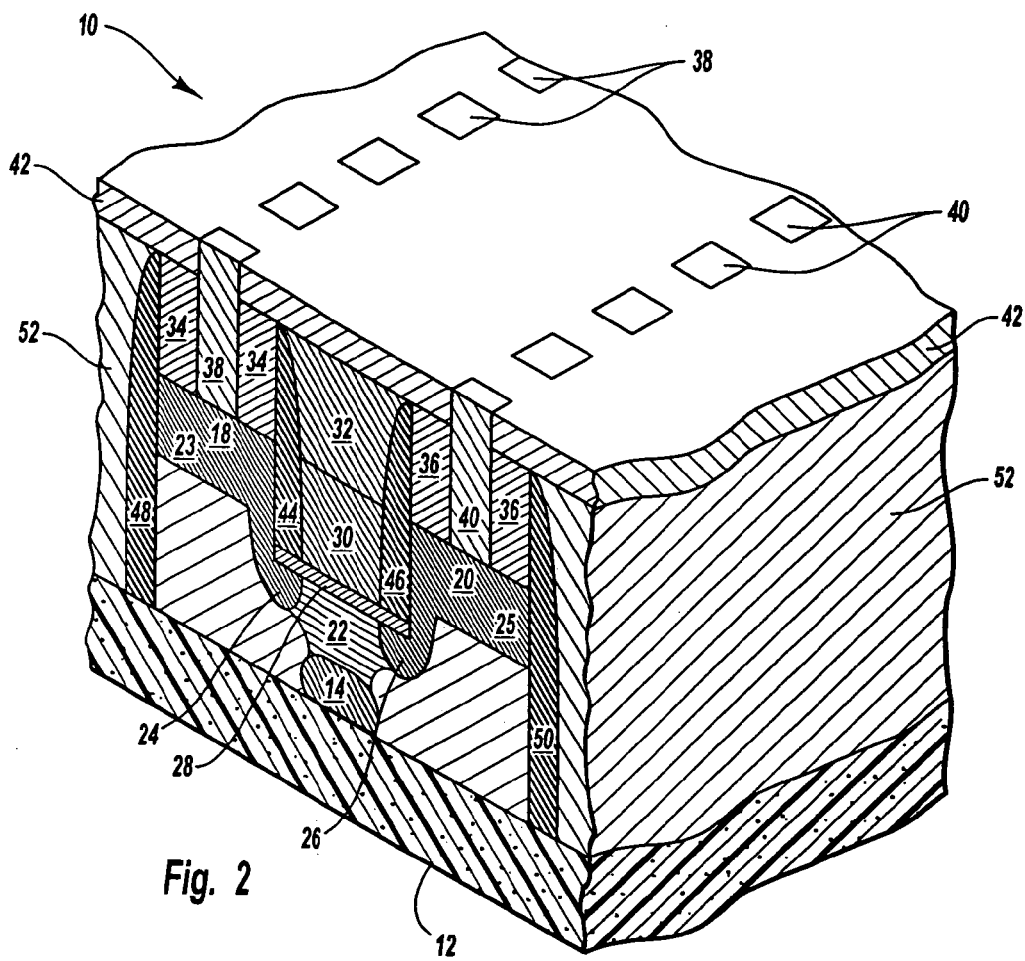
FIG. 2 is an isometric view of the transistor of FIG. 1.

Referring to FIG. 2, an isometric view of the transistor 10 illustrates the upper surface of the ILD layer 42. As shown, the contact layers 38, 40 extend through the ILD layer 42 to enable access to the source 18 and drain 20. The contact layers 38, 40 may provide any number of accesses to the source 18 and drain 20 based on design preferences.

Figure 3:
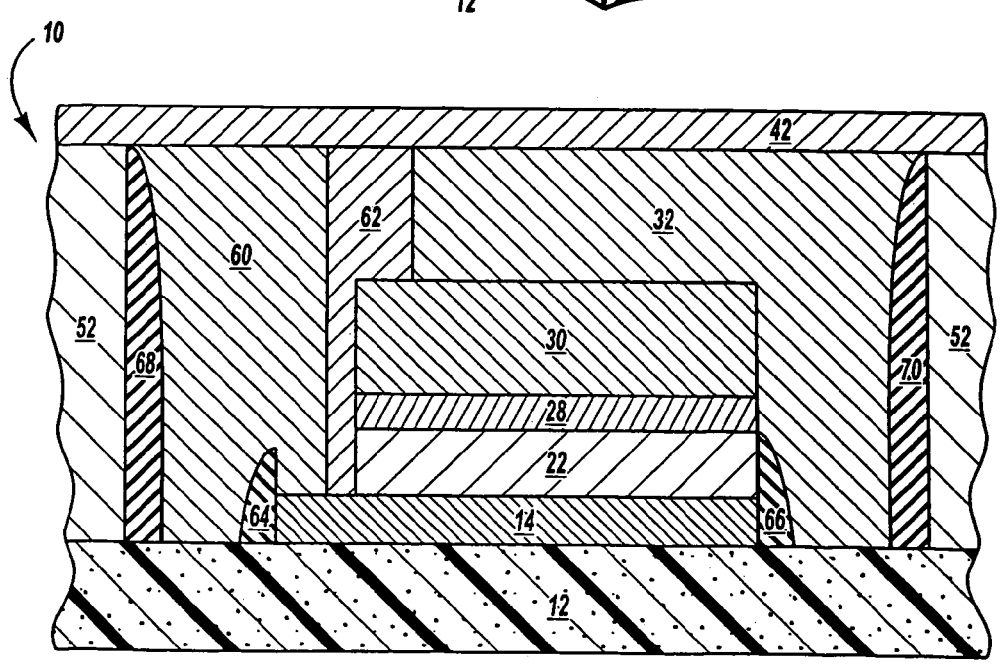
FIG. 3 is a cross-sectional view of the length of the transistor of FIG. 1 along line 3—3.

Referring to FIG. 3, a cross-sectional view of the transistor 10 taken along length 3—3 illustrated in FIG. 1 is shown. The transistor 10 is a four terminal, double-gated device with each gate having an independent bias. The substrate 12, bottom gate 14, channel 22, gate dielectric insulator 28, top gate 30, conducting layer 32, and ILD layer 42 are shown vertically disposed relative to one another. Further shown is a second local interconnect 60 that couples to the bottom gate 14 and provides an independent bias to the bottom gate 14. The second local interconnect 60 is the same material as the first local interconnect 32. The first and second local interconnects 32, 60 together provide the local interconnect for the top and bottom gates 14, 30.

The second local interconnect 60 is separated from the first local interconnect 32 by an STI insulator 62. The insulator 62 may be formed of any suitable material such as an oxide or nitride. In this manner, the top gate 30 and the bottom gate 14 are independently biased. As shown, the top gate 30 is offset relative to the bottom gate 14 to enable separate bias. The offset is accomplished by appropriately positioning the top gate mask along the x-axis during the manufacture process.

Fifth and sixth spacers 64, 66 are disposed adjacent the bottom gate 14 to insulate the bottom gate 14 as needed. In the four terminal device, the sixth spacer 66 separates the bottom gate 14 and the channel 22 from the first local interconnect 32.

Seventh and eighth spacers 68, 70 are disposed to isolate the transistor 10. The spacers 68, 70 may be extensions of the spacers 48, 50 that surround the transistor 10. The insulating layer 52 surrounds and further isolates the transistor 10.

Figure 4:
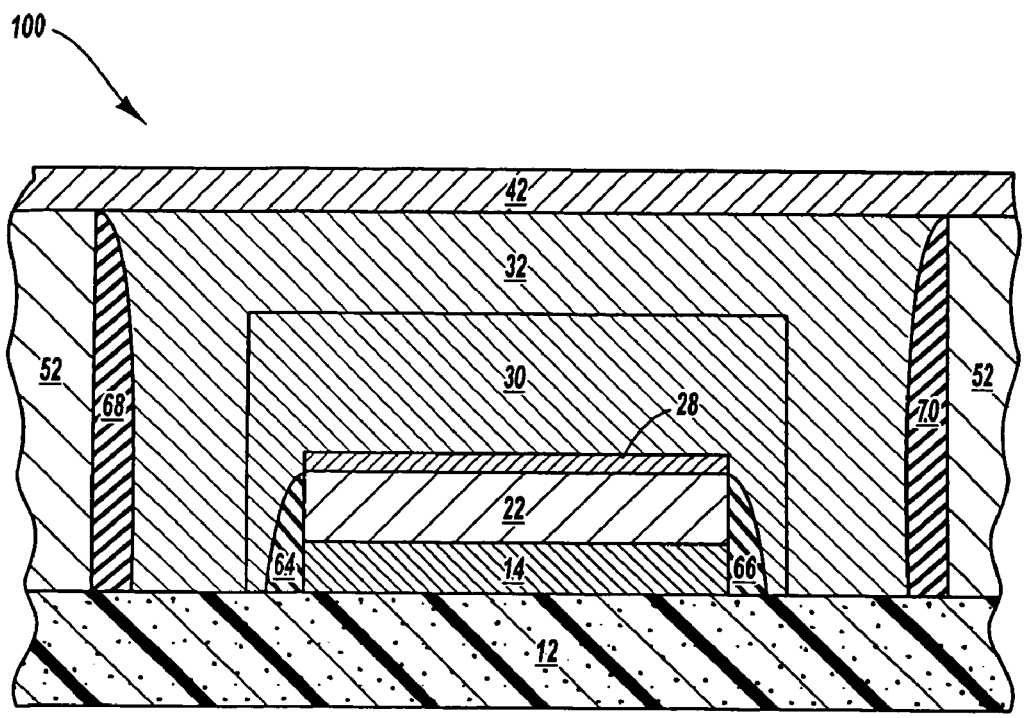
FIG. 4 is a cross-sectional view of the length of an alternative embodiment of a transistor.

Referring to FIG. 4, an alternative embodiment of a transistor 100 is shown wherein the bottom gate 14 is electrically isolated by the spacers 64, 66 and the dielectric layer 16. This embodiment is referenced herein as a lateral bipolar transistor. The top gate 30 extends over the spacers 64, 66 and covers the gate dielectric insulator 28, channel 22, and bottom gate 14. A second local interconnect 60 and an insulator 62 are not required and not present in this embodiment.

In manufacture, a top gate mask is used that extends over a larger area than the bottom gate 14. The top gate 30 and the bottom gate 14 are aligned relative to one another along the x-axis so that the bottom gate 14 is within the perimeter of the top gate 30.

Figure 5:
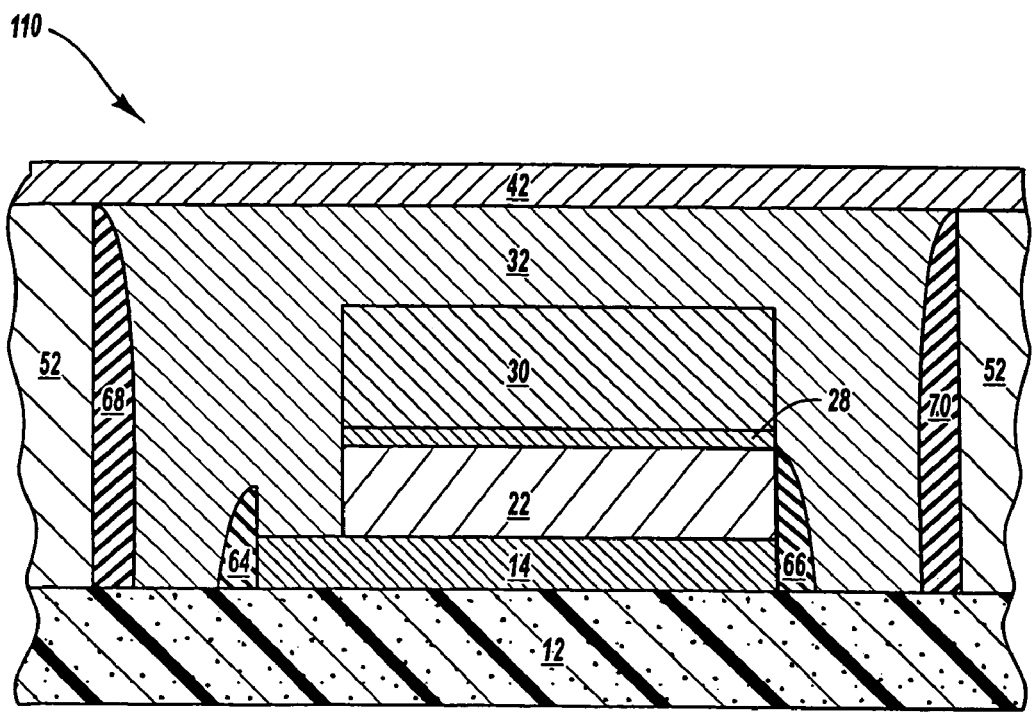
FIG. 5 is a cross-sectional view of the length of an alternative embodiment of a transistor.

Referring to FIG. 5, an alternative embodiment of a transistor 110 of the present invention is shown. The transistor 110 is a dynamic threshold (DTMOS) device wherein the top and bottom gates 14, 30 are shorted to one another. The top gate 30 and the bottom gate 14 are disposed in an offset relationship similar to that of FIG. 3. The transistor 110 does not include a second local interconnect 60 or an insulator 62. Instead, the first local interconnect 32 occupies the space formerly reserved for the second local interconnect 60 and insulator 62 and couples with both the top and bottom gates 14, 30. An advantage of the present invention is that the DTMOS application occupies the same footprint as a three terminal device and incurs no layout penalty.

Positioning the top gate and bottom gate masks in the x-axis relative to one another provides a four terminal device, a lateral bipolar transistor, or a DTMOS MOSFET. As such, the present invention provides a flexible transistor architecture that is adjusted by mask positioning to create different transistor configurations.

Figure 6:
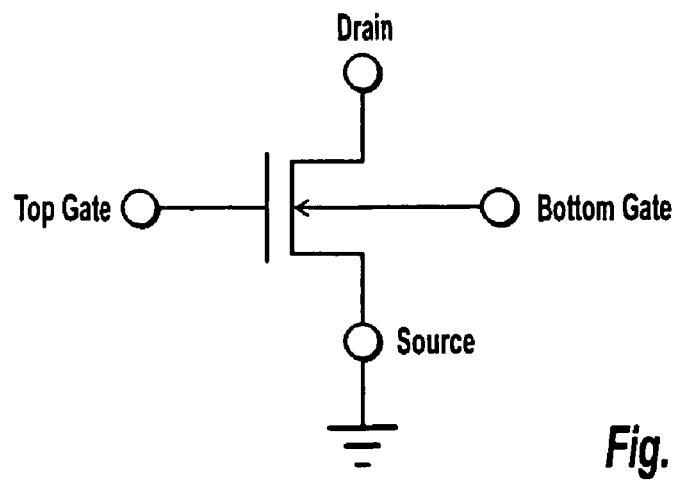
FIG. 6 is a schematic representation of the embodiment of FIG. 3.
Figure 7:
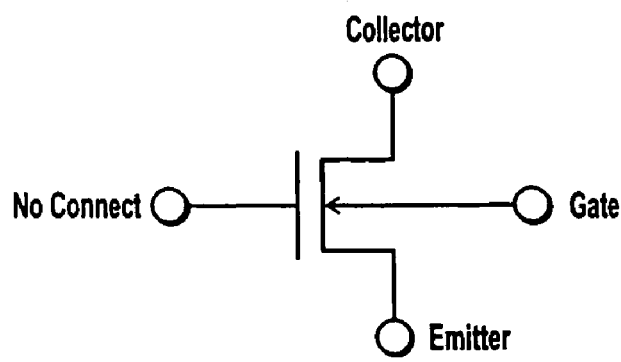
FIG. 7 is a schematic representation of the embodiment of FIG. 4.
Figure 8:
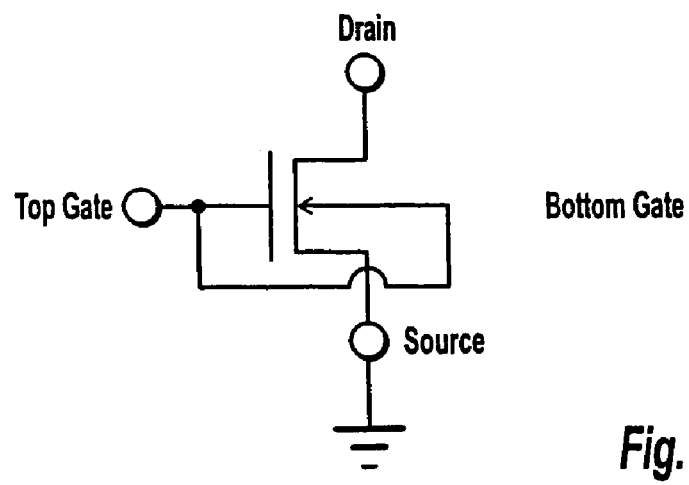
FIG. 8 is a schematic representation of the embodiment of FIG. 5.

Referring to FIGS. 6, 7, and 8, schematic representations of the transistor embodiments corresponding to FIGS. 3, 4, and 5 are shown. FIG. 6 illustrates a four terminal device that provides independent bias to the top gate 30 and the bottom gate 14. FIG. 7 illustrates a lateral bipolar transistor wherein the bottom gate 14 is effectively grounded. FIG. 8 illustrates a DTMOS device wherein the bottom gate 14 and the top gate 30 are shorted to one another. As is well known in the art, each device represented in FIGS. 6–8 has specific uses that are suitable for different applications.

Figure 9:
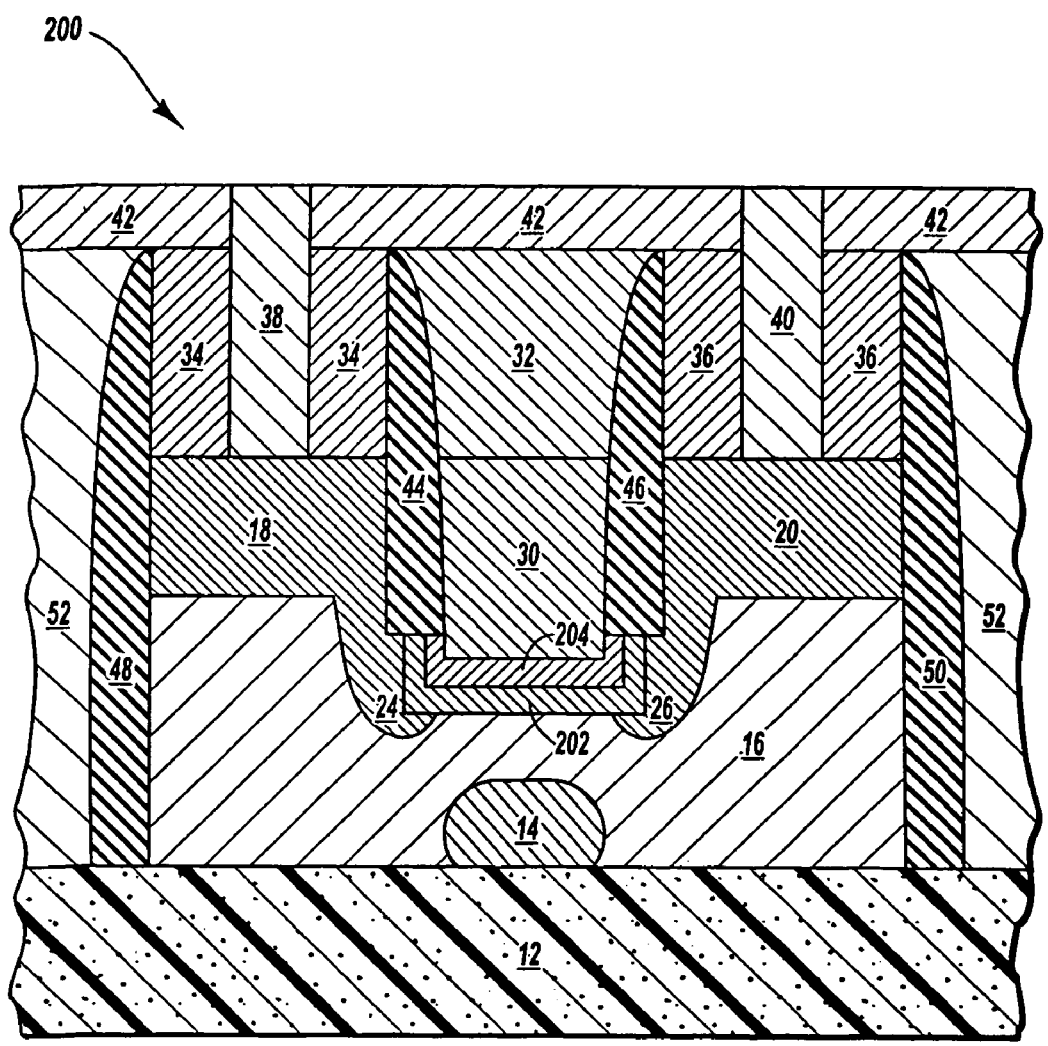
FIG. 9 is a cross-sectional view of an alternative embodiment of a transistor of the present invention.

Referring to FIG. 9, a cross-sectional view of an alternative embodiment of a transistor 200 of the present invention is shown. The transistor 200 is similar to that previously illustrated in FIG. 1 in that the source 18 and drain 20 each include a respective extension 24, 26 coupled to a channel 202. As before, spacers 44, 46 are disposed between the majority of the source 18 and drain 20 and the channel 202 to reduce the field effect on the channel 202.

The channel 202 is U-shaped which increases the channel length and the electron flow path. The increased channel length allows for greater gate control over the channel 202. Thus, the gate control over the channel 202 is significantly improved at the expense of an increased channel length.

A gate dielectric insulator 204 is disposed on the channel 202 and may also be U-shaped as it conforms to the channel 202. Alternatively, the gate dielectric insulator 204 may be shaped in other forms and still be within the scope of the present invention.

Other elements of the transistor 200 operate in a similar fashion to that previously described above. A cross-sectional view of the length of the transistor 200 would be similar to that shown in FIG. 3. As can be appreciated, the view shown in FIG. 3 would be adjusted to account for the position of the channel 202 and gate dielectric insulator 204.

Figure 10:
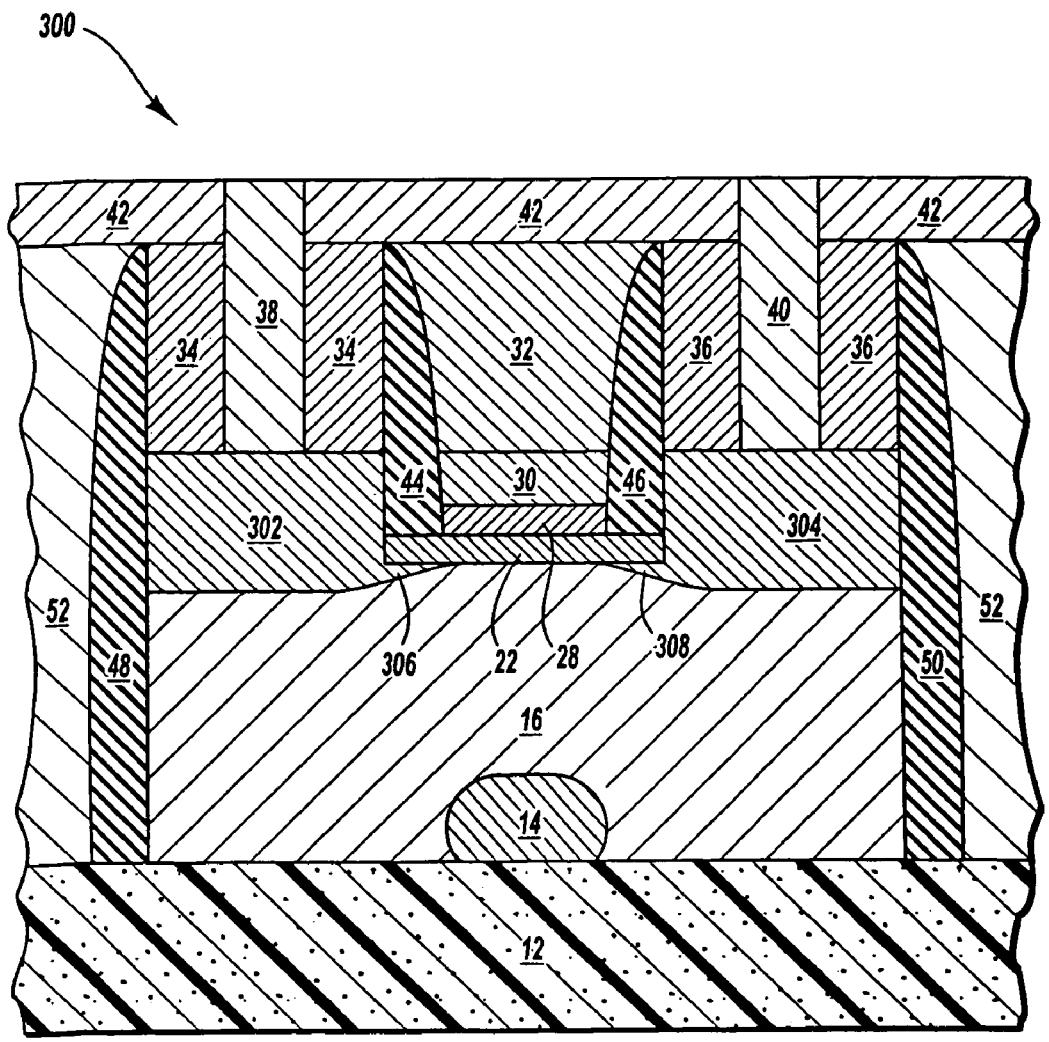
FIG. 10 is a cross-sectional view of an alternative embodiment of a transistor of the present invention.

Referring to FIG. 10, there is shown a cross-sectional view of an alternative embodiment of a transistor 300 of the present invention. As illustrated, the transistor 300 is similar to the embodiment of FIG. 1 and primarily differs in the shape of the source 302, drain 304, and their corresponding extensions 306, 308. The source 302 and drain 304 are vertically aligned closer to the channel 22 than in the previous embodiment. As such, the extensions 306, 308 are shorter and extend primarily in a horizontal direction to couple with the channel 22. The shorter extensions 306, 308 reduce the resistance in the electron flow path.

As in previous embodiments, spacers 44, 46 are disposed between the channel 22 and the majority of the source 302 and drain 304. Accordingly, the channel 22 is partially shielded to reduce the field effect and provide superior gate control.

Figure 11:
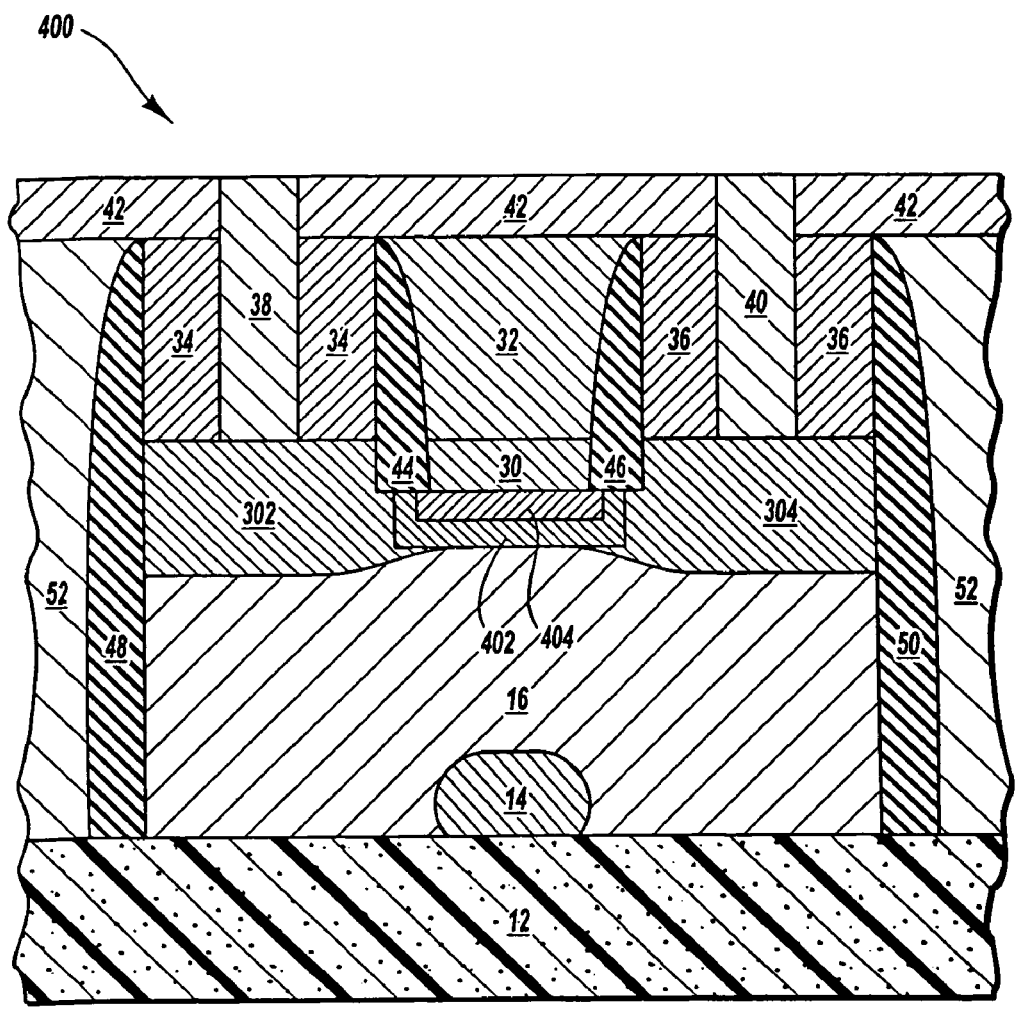
FIG. 11 is a cross-sectional view of an alternative embodiment of a transistor of the present invention.

Referring to FIG. 11, a cross-sectional view of an alternative embodiment of a transistor 400 of the present invention is shown. The transistor 400 is similar to that of FIG. 10 with the primary difference being the shape of the channel 402. The channel 402 is in a U-shape similar to the embodiment of FIG. 9. The increased channel length improves the gate control while increasing the resistance experienced in the flow path. A gate dielectric insulator 404 is disposed on the channel 402 and may have a planar configuration as shown or have a U shape.

Transistors 200, 300, 400 may also be referred to as a configurable transistor in that the alignment of the top gate and bottom gate determines the terminal connections, electrical behavior, and threshold voltage of the device. Thus, the transistors 200, 300, 400 may be embodied as a four terminal device, lateral bipolar transistor, or a DTMOS MOSFET as explained in reference to FIGS. 3 to 8.

Figure 12:
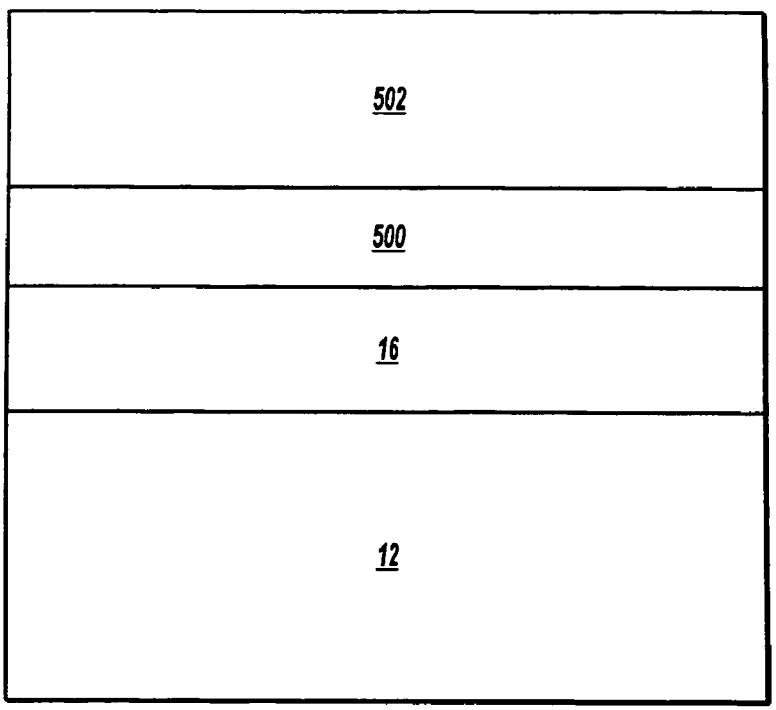
FIG. 12 is a cross-sectional view of layers used in the fabrication of the transistor of FIG. 1.

Referring to FIG. 12 to a method for manufacturing the transistor 10 of FIG. 1 is shown. One of skill in the art will appreciate that various processes may be used to create a transistor structure and are included within the scope of the invention. The method described herein is exemplary and is for illustrative purposes only.

Referring more specifically to FIG. 12, a cross-sectional view of preliminary layers used in fabrication is shown. The transistor 10 includes a substrate layer 12 that may be formed of any number of resistive materials suitable for the present invention. In one implementation, the substrate 12 may include a lower layer of silicon and a buried oxide layer disposed thereon. A SOI layer 16, such as crystalline silicon, is formed on the substrate layer 12 by any known method. A source/drain layer 500 is formed on the substrate layer 12 and may also include crystalline silicon that is doped with ion implants to form a N+material. The source/drain layer 500 may be subjected to a metalization step wherein a silicide is applied and removed to improve performance. Typically a silicide such as TiSi, MoSi, or CoSi, is sputtered onto the surface of the source/drain layer 500 and then stripped away to increase electron mobility. A dielectric layer 502 is formed on the source/drain layer 500. The dielectric layer 502 includes either silicon nitride or silicon oxide.

Figure 13:
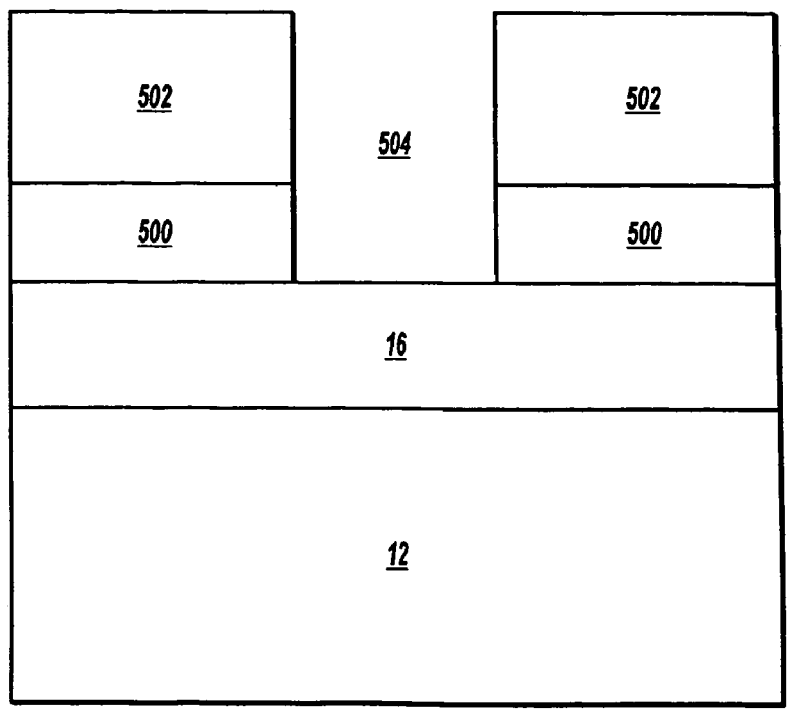
FIG. 13 is a cross-sectional view of the device of FIG. 12 after formation of a trench.

Referring to FIG. 13, a trench is formed in the dielectric layer 502 and the source/drain layer 500. The trench is etched in accordance with an applied trench mask to form the main bodies 23, 25, of the source 18, and drain 20.

Figure 14:
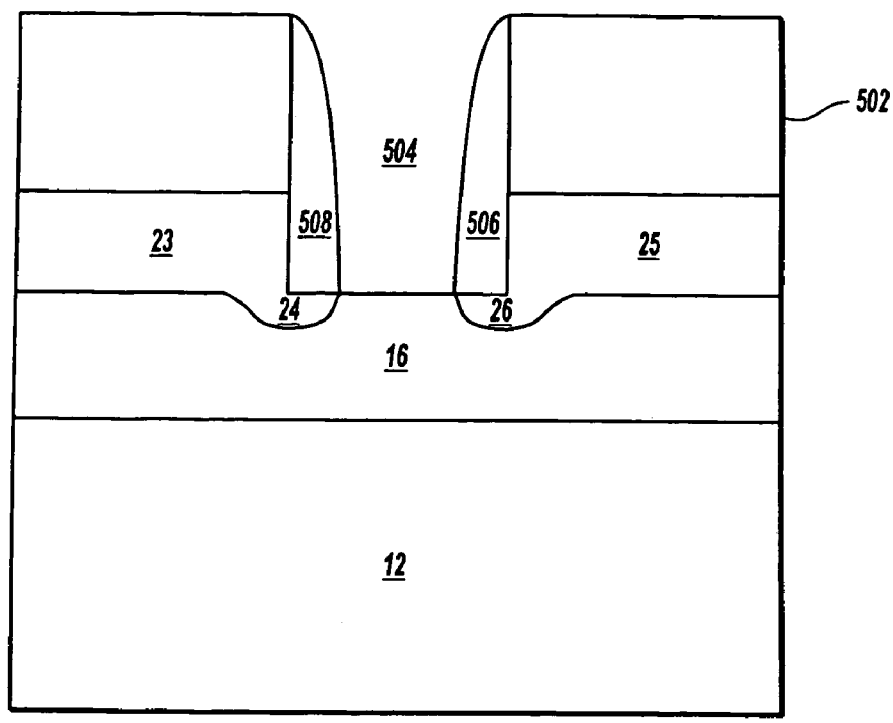
FIG. 14 is a cross-sectional view of the device of FIG. 13 device after formation of doped sidewalls.

Referring to FIG. 14, a solid source doping technique is used to form the source and drain extensions 24, 26. A layer of a heavily doped solid is formed within the trench 504 and then etched to provide doped sidewalls 506. The doped sidewalls 506 act as a source to infuse a dopant to the SOI layer 16. The regions of the SOI layer 16 proximate to the sidewalls 506 become the N+ source and drain extensions 24, 26. In an alternative technique, the extensions 24, 26 may be formed by conventional ion implantation.

Figure 15:
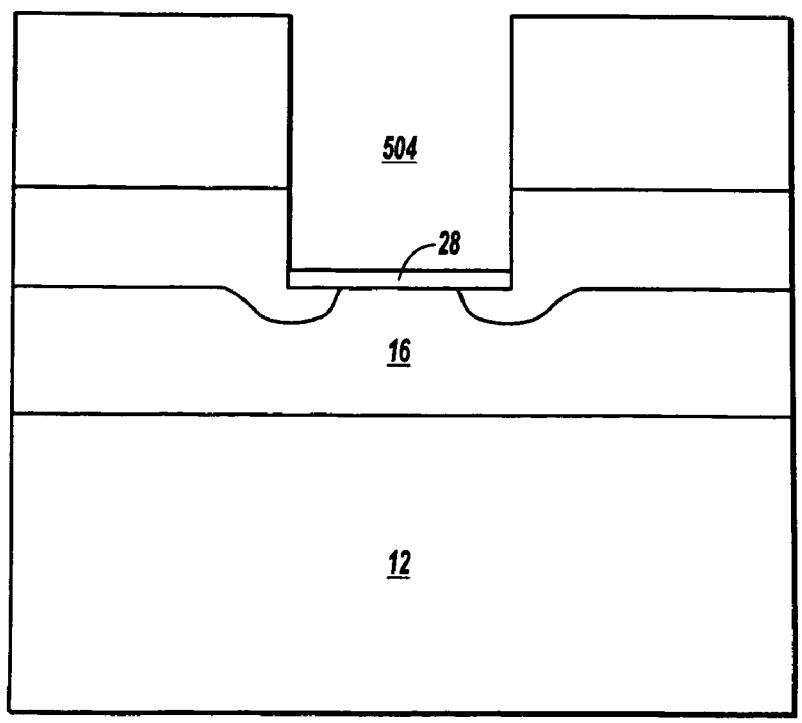
FIG. 15 is a cross-sectional view of the device of FIG. 14 after removal of the doped sidewalls and formation of a gate dielectric insulator.

Referring to FIG. 15, the doped sidewalls 506 are removed. A dielectric layer is formed within the trench 504 and etched to form a gate dielectric insulator 28 on the trench bottom.

Figure 16:
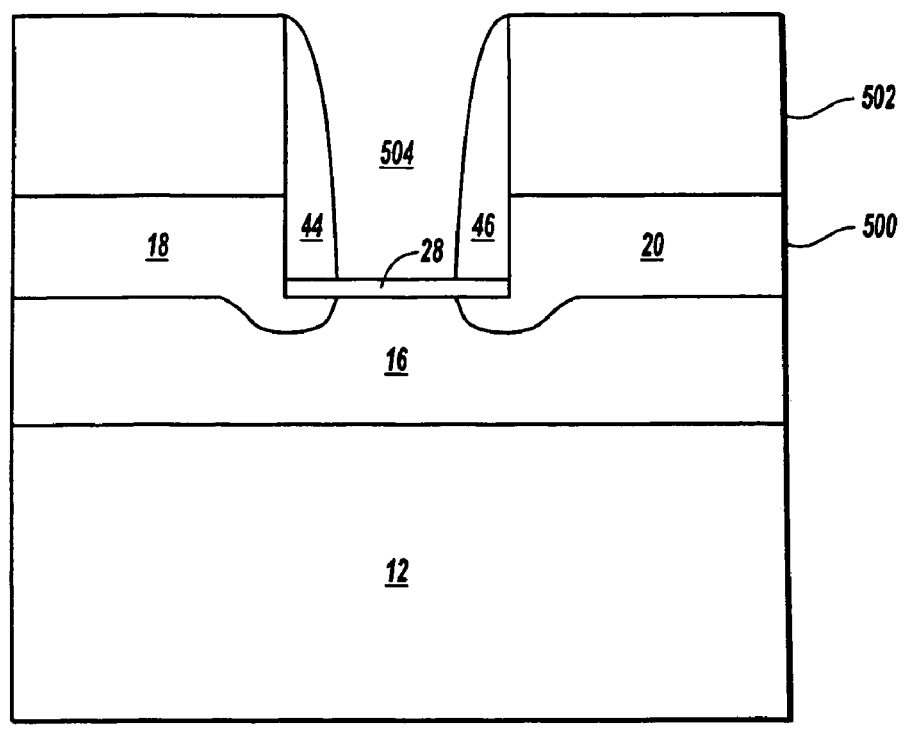
FIG. 16 is a cross-sectional view of the device of FIG. 15 after formation of spacers.

Referring to FIG. 16, a layer of silicon nitride is formed within the trench 504 and etched to form first and second spacers 44, 46.

Figure 17:
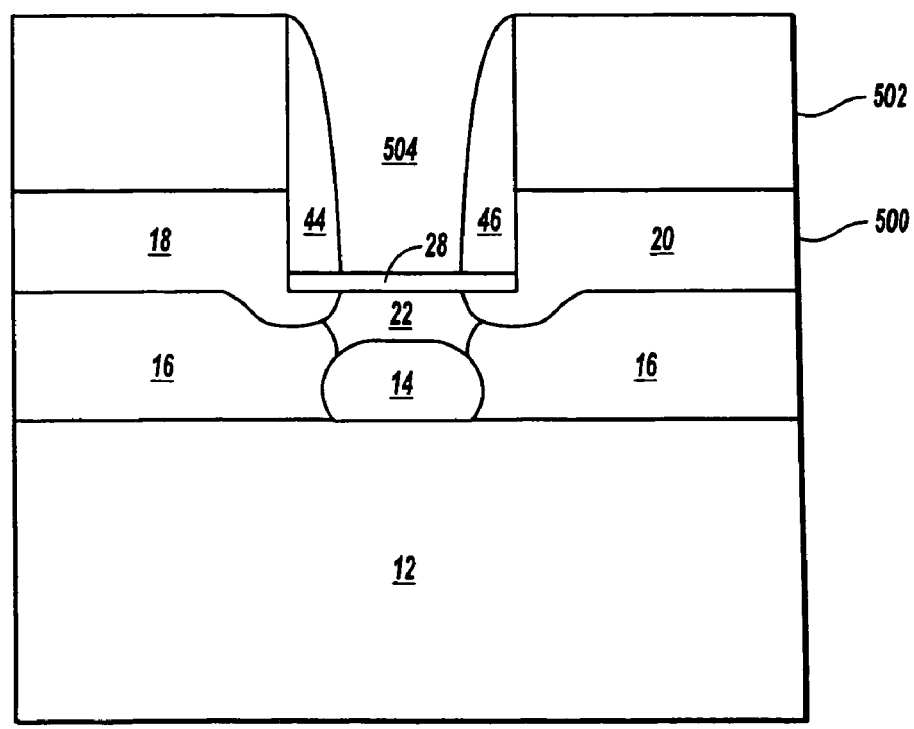
FIG. 17 is a cross-sectional view of the device of FIG. 16 after formation of a bottom gate.

In FIG. 17, the SOI layer 16 is doped with high level ion implants to form a P+ bottom gate 14. The ion implants are directed through the trench 504 to contact the SOI layer 16 and form the bottom gate 14 in the appropriate location. A channel 22 is defined as the proximate area between the bottom gate 14, extensions 24, 26, and gate dielectric insulator 28.

Figure 18:
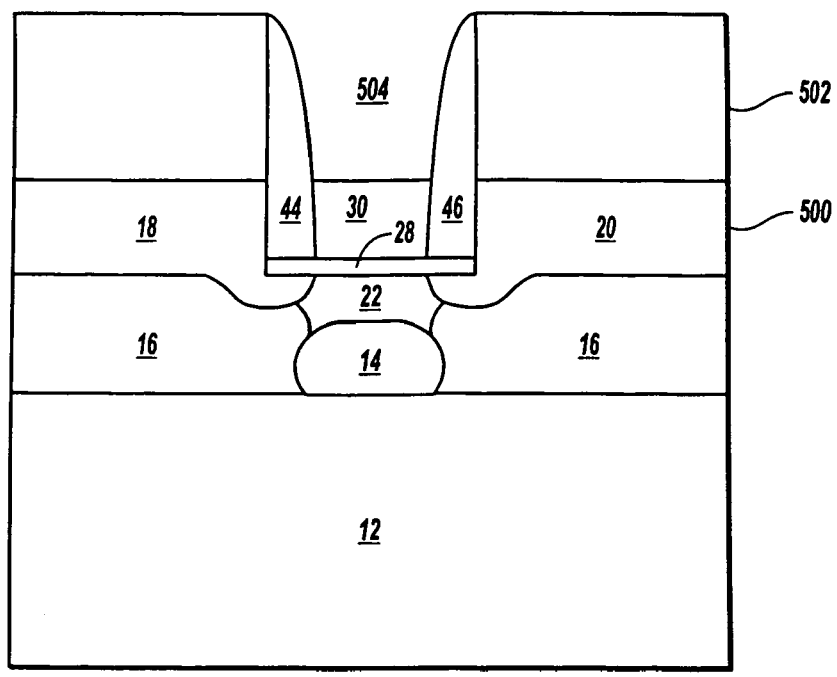
FIG. 18 is a cross-sectional view of the device of FIG. 17 after formation of a top gate.

Referring to FIG. 18, a top gate layer is deposited within the trench 504 using any number of methods such as sputtering, evaporation, pulsed laser ablation, oxidation, chemical vapor deposition, electroplating, and other techniques commonly known in the art. The top gate layer is then etched to form the top gate 30 in accordance with a top gate mask. Configuration of the top gate mask and doping of the bottom gate may be altered to manufacture alternative devices such as those shown in FIGS. 4 and 5. The top gate 30 may also be subjected to a metalization step such as the source/drain layer 500 to mobility performance.

Figure 19:
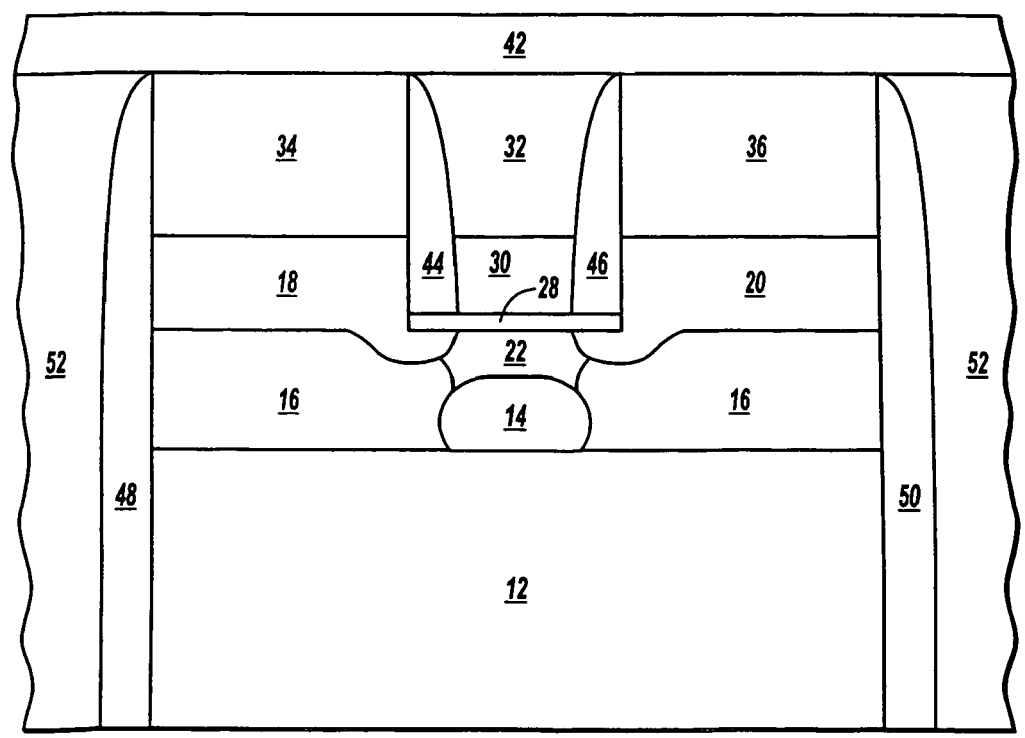
FIG. 19 is a cross-sectional view of the device of FIG. 18 after formation of a first local interconnect and an ILD layer.

Referring to FIG. 19, a conductive layer is formed within the trench 504 and planarized to form the first local interconnect 32. Although not illustrated in FIG. 19, the second local interconnect 60 is disposed adjacent the insulator 62 and in contact with the bottom gate 14 as shown in FIG. 3.

Spacers 48, 50 are formed on the perimeter of the transistor 10 to isolate the transistor 10. Formation of the spacers 48, 50 may occur simultaneously with the formation of spacers 44, 46. An STI layer 52 is formed proximate to the spacers 48, 50 to further isolate the transistor 10. Formation of the STI layer 52 may occur at any time after formation of the spacers 48, 50. An ILD layer 42 is disposed on the pads 34, 36, local interconnect 32, and STI layer 52 and then planarized.

Figure 20:
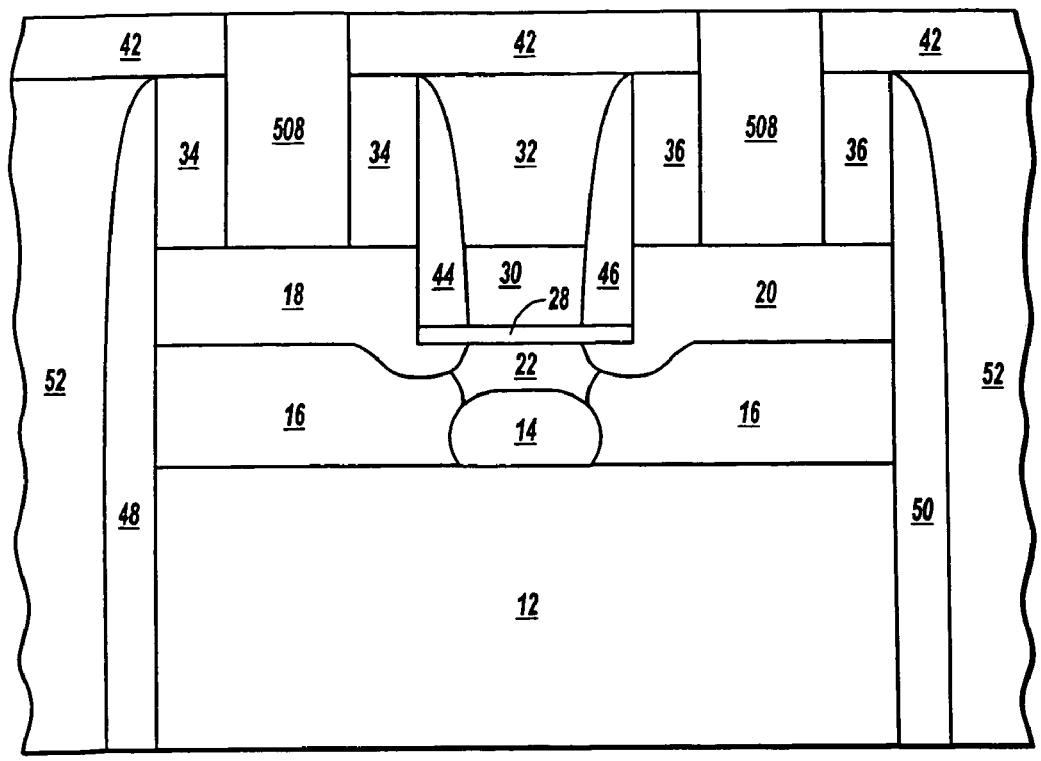
FIG. 20 is a cross-sectional view of the device of FIG. 19 after formation of contacts.

Referring to FIG. 20, a contact mask is applied to the ILD layer 42, and pads 34, 36 to form wells 508 that provide access to the source 18 and drain 20. A conductive layer is formed in the wells 508 and planarized to create contact layers 38, 40.

Similar techniques may be employed to manufacture the embodiments shown in FIGS. 9 to 11. Variances in deposition and etching techniques as well as variances in materials used may be employed and are within the scope of the invention.

A further advantage of the present invention is its inherent radiation hardness. To limit radiation sensitivity, the pads 34, 36, exterior spacers 48, 50, 68, 70, and dielectric layer 16 may all be embodied as a nitride. The exterior spacer 48, 50, 68, 70 surround the transistor components. With the addition of the pads, 34, 36, the transistor 10 is encapsulated within nitride to provide a buffer against radiation. Radiation will tend to accumulate within an oxide such as in a buried oxide of the substrate 12. The source 18 and drain 20 are separated from the substrate 12 by the dielectric layer 16 to limit the effect of accumulated radiation. Remaining radiation effects may be compensated by dynamic control of the bottom gate 14.

The present invention provides a unique transistor architecture that greatly improves gate control of the channel. The improved gate control is achieved in various embodiments by providing extensions to distance the source and drain, spacers to insulate against the source and drain, and increased channel length. The resulting electron flow path has high mobility and high current drive. The transistor architecture is flexible and may be configured with different terminal connections for different electrical behavior. In one embodiment, the present invention provides a double-gated transistor with independent gate control.

Figure 21:
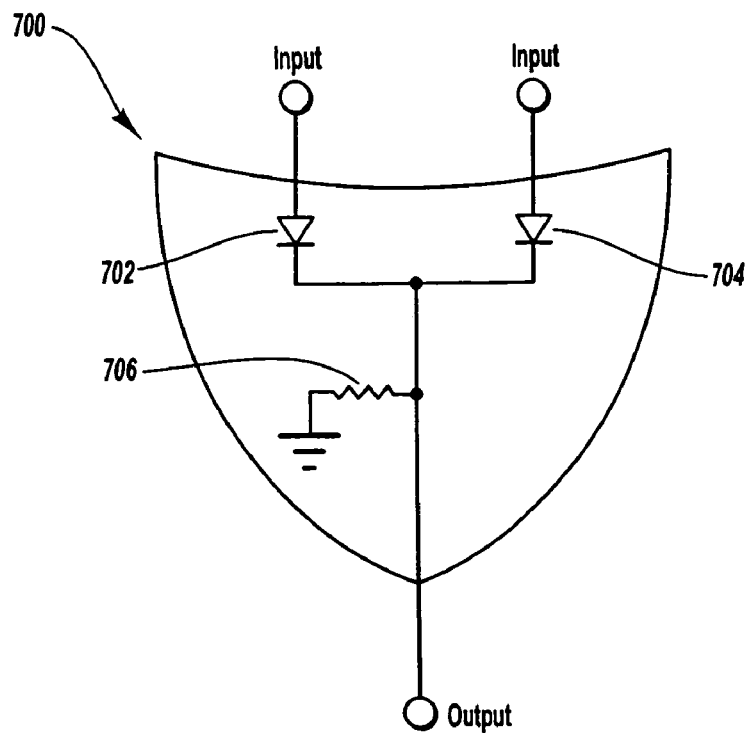
FIG. 21 is an OR gate circuit.

Referring to FIG. 21, one embodiment of an OR gate circuit 700 is shown. The circuit 700 includes first and second diodes 702, 704, disposed parallel to one another. The diodes 702, 704 are coupled to a resistor 706 to provide an output voltage. In this simple circuit 700, the output is 1 if either of the inputs is 1.

Figure 22:
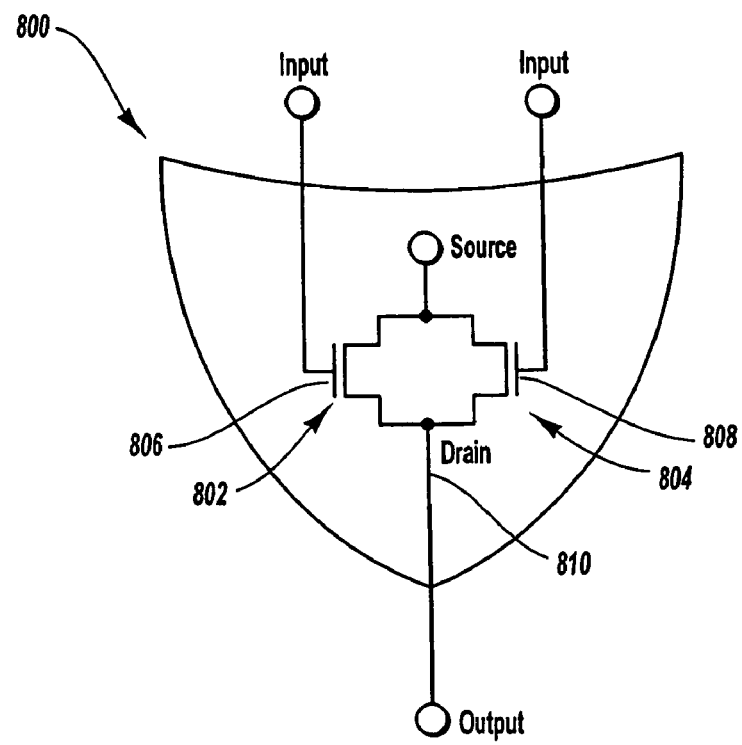
FIG. 22 is an OR gate circuit.

Referring to FIG. 22, an alternative embodiment of an OR gate circuit 800 is shown. The circuit 800 includes two field effect transistors 802, 804 that are disposed in parallel. Each transistor 802, 804 includes a gate electrode 806, 808 coupled to an input. The transistors 802, 804 are coupled to one another at a drain 810 which is either charged high or low. A gate voltage to either or both gate electrodes 806, 808 results in the drain 810 changing to an alternative state. As such, the output likewise changes to the alternative state. The embodiments of FIGS. 21 and 22 operate effectively but require more components than what may otherwise be realized.

Figure 23:
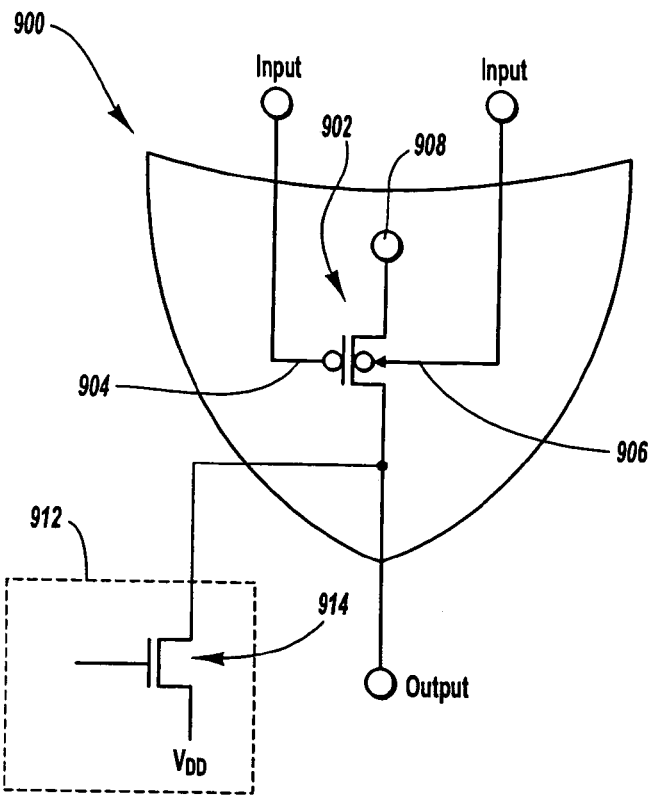
FIG. 23 is an embodiment of an OR gate circuit of the present invention.

Referring to FIG. 23, an embodiment of an OR gate circuit 900 of the present invention is shown. The OR gate includes a double-gated field effect transistor 902 having a top gate 904, a bottom gate 906, a source 908, and drain 910. The flexible field effect transistors described above may be used effectively as the transistor 902 provided that the top and bottom gates 904, 906 are independent as discussed in reference to FIGS. 3 and 6. Each input provides an independent bias to the corresponding top and bottom gates 904, 906.

Alternative embodiments for double-gated field effect transistors may also be used for the transistor 902 provided that gate electrodes are independent. By way of example, U.S. Pat. Nos. 6,506,638B1, 6,483,156B1, 6,365,465B1, and 5,349,228 described double-gated transistors that may be incorporated in the present invention.

The drain 910 is coupled to the output as well as a common precharge source 912. The precharge source 912 may be coupled to numerous transistors to provide a charge at the drain node. The precharge source 912 charges the drain 910 to a low voltage condition which provides a 0 output value. An input to either or both gates 904, 906 results in the drain 910 being pulled to a high voltage condition which provides a 1 output value. In this embodiment, the precharge source 912 includes a NMOS transistor 914 coupled to a Vdd as shown and the transistor 902 is a PMOS transistor.

Figure 24:
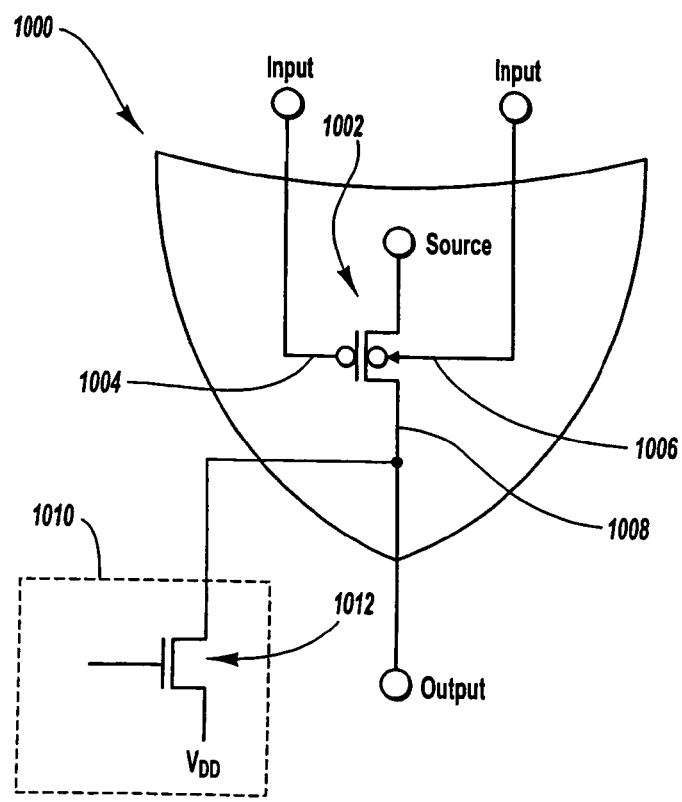
FIG. 24 is an embodiment of a NOR gate circuit of the present invention.

Referring to FIG. 24, an embodiment of a NOR gate circuit 1000 is shown. The transistor 1002 is once again double-gated with independent gate control. The top and bottom gates 1004, 1006 are coupled to the inputs. The transistor 1002 is an NMOS which may be embodied as a flexible FET described above with all of the associated advantages. Alternatively, the transistor 1002 may be selected from various known double-gated configurations and modified to provide independent gate control.

The transistor 1002 is coupled at its drain 1008 to a precharge source 1010 that charges the drain 1008 to a high voltage condition. The precharge source 1010 includes a PMOS transistor 1012 that is coupled to a Vdd. An input to either or both the top and bottom gates 1004, 1006 results in the drain 1008 being pulled to a low voltage condition which provides a 0 output value.

The present invention provides an OR gate architecture that realizes the combination of two parallel transistors in a single transistor. The single transistor OR gate requires less layout size than that shown in FIGS. 21 and 22. The single transistor OR gate may be used in numerous complex circuit to significantly reduce the size. A single transistor further provides lower power dissipation, higher speed, and reduces instances of parasitic capacitance. As a flexible FET transistor, the transistor provides improved gate control and inherent radiation resistance.

It will be obvious to those having skill in the art that many changes may be made to the details of the above-described embodiments without departing from the underlying principles of the invention. The scope of the present invention should, therefore, be determined only by the following claims.

What is claimed is:

1. A NOR gate circuit, comprising:
   a first input;
   a second input;
   a double-gated field effect transistor including,
      a source,
      a top gate coupled to the first input,
      a bottom gate coupled to the second input,
      a drain,
      a channel disposed on the bottom gate and coupled to and disposed between the source and the drain, the channel providing a junction contact to the bottom gate to form a JFET; and
   an output coupled to the drain.

2. The NOR gate circuit of claim 1, wherein the field effect transistor is an NMOS transistor.

3. The NOR gate circuit of claim 1, further comprising a precharge transistor coupled to the drain to effect a high voltage on the drain.

4. The NOR gate circuit of claim 3, wherein the precharge transistor is a PMOS transistor.

5. The NOR gate circuit of claim 1, wherein a gate insulator is disposed on the channel.

6. The NOR gate circuit of claim 5, wherein the gate insulator has a cross-sectional U-shape.

7. The NOR gate circuit of claim 1, wherein the channel is undoped.

8. The NOR gate circuit of claim 1, wherein the double-gated field effect transistor further comprises:
   a substrate upon which the bottom gate is disposed,
   a dielectric layer disposed on the bottom gate and the substrate, and
   a plurality of spacers disposed on the substrate and proximate to the dielectric layer, source, and drain.

9. The NOR gate circuit of claim 8, further comprising an insulator layer disposed on the substrate and coupled to the spacers.

10. A NOR gate circuit, comprising:
a first input;
a second input;
a double-gated field effect transistor including,
  a substrate,
  a bottom gate disposed on the substrate and coupled to the second input,
  a dielectric disposed on the bottom gate and the substrate,
  a channel having a cross-sectional U-shape disposed on the dielectric,
  a source disposed on the dielectric and having a source extension extending from the main body of the source and coupled to the channel,
  a drain disposed on the dielectric and having a drain extension extending from the main body of the drain and coupled to the channel,
  a gate insulator disposed on the channel,
  a top gate disposed on the gate insulator and coupled to the first input,
  a first spacer disposed between the top gate and the source and proximate to the source extension, and
  a second spacer disposed between the top gate and the drain and proximate to the drain extension; and
an output coupled to the drain.

11. The NOR gate circuit of claim 5, wherein the field effect transistor is a NMOS transistor.

12. The NOR gate circuit of claim 10, further comprising a precharge transistor coupled to the drain to effect a high voltage on the drain.

13. The NOR gate circuit of claim 12, wherein the precharge transistor is a PMOS transistor.

14. The NOR gate circuit of claim 10, wherein the gate insulator has a cross-sectional U-shape.

15. The NOR gate circuit of claim 10, wherein the channel is undoped.

16. The NOR gate circuit of claim 10, further comprising a plurality of exterior spacers disposed on the substrate and proximate to the dielectric layer, source, and drain.

17. The NOR gate circuit of claim 10, further comprising an insulator layer disposed on the substrate and coupled to the exterior spacers.

* * * * *